(12) United States Patent
Matsubara et al.

(10) Patent No.: US 10,637,465 B2
(45) Date of Patent: Apr. 28, 2020

(54) DRIVING DEVICE AND SWITCHING DEVICE

(71) Applicant: FUJI ELECTRIC CO., LTD., Kanagawa (JP)

(72) Inventors: Kunio Matsubara, Hino (JP); Tsuyoshi Nagano, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/429,080

(22) Filed: Jun. 3, 2019

(65) Prior Publication Data

US 2020/0036380 A1 Jan. 30, 2020

(30) Foreign Application Priority Data

Jul. 25, 2018 (JP) .................................. 2018-139561

(51) Int. Cl.
*H03K 17/284* (2006.01)
*H02M 1/08* (2006.01)
(Continued)

(52) U.S. Cl.
CPC ......... *H03K 17/284* (2013.01); *G01R 19/165* (2013.01); *H02M 1/08* (2013.01); *H03K 17/08142* (2013.01)

(58) Field of Classification Search
CPC ........... H03K 17/284; H03K 17/08142; G01R 19/165; G01R 19/16504; G01R 19/16509; G01R 19/16519; G01R 19/16528–16595; G01R 19/17; G01R 19/16523; H02M 1/08; H02M 1/081; H02M 1/082; H02M 1/083;
(Continued)

(56) References Cited

U.S. PATENT DOCUMENTS 10,128,832 B2    11/2018 Xu
2013/0002227 A1   1/2013 Ikeda
(Continued)

FOREIGN PATENT DOCUMENTS

CN    104348341 A    2/2015
CN    105991004 A    10/2016
(Continued)

OTHER PUBLICATIONS

Office Action issued for counterpart Japanese Application No. 2018-139561, issued by the Japan Patent Office dated Sep. 11, 2018 (drafted on Sep. 3, 2018).
(Continued)

*Primary Examiner* — Patrick C Chen

(57) ABSTRACT

In recent years, it has been desired to further shorten the dead time. Provided is a driving device that drives on/off a main switching element to which a free wheeling diode is anti-parallel connected, wherein the driving device includes a determination unit configured to output a determination signal indicating whether free wheeling current is flowing from a source terminal to a drain terminal of the main switching element; and a drive control unit configured to reduce a switching speed when the main switching element is driven from an on-state to an off-state on condition that the determination signal indicating that the free wheeling current is flowing is output.

10 Claims, 6 Drawing Sheets

(51) Int. Cl.
*G01R 19/165* (2006.01)
*H03K 17/0814* (2006.01)

(58) Field of Classification Search
CPC .... H02M 1/084; H02M 1/0845; H02M 1/088; H02M 1/092; H02M 1/096
See application file for complete search history.

(56) References Cited

U.S. PATENT DOCUMENTS

| | | | |
|---|---|---|---|
| 2015/0035569 A1 | 2/2015 | Miura | |
| 2015/0035584 A1 | 2/2015 | Fujita | |
| 2015/0155863 A1* | 6/2015 | Takasu | H03K 17/08142 327/108 |
| 2018/0205372 A1 | 7/2018 | Sasaki | |
| 2018/0316344 A1 | 11/2018 | Matsubara | |

FOREIGN PATENT DOCUMENTS

| | | |
|---|---|---|
| CN | 107134915 A | 9/2017 |
| DE | 102014214773 A1 | 2/2015 |
| DE | 102014226165 A1 | 6/2016 |
| JP | 2009183017 A | 8/2009 |
| JP | 2013187940 A | 9/2013 |
| JP | 5939908 B2 | 6/2016 |
| JP | 2016158478 A | 9/2016 |
| JP | 2017051049 * | 3/2017 |
| JP | 2017051049 A | 3/2017 |
| JP | 6168253 B1 | 7/2017 |
| JP | 6336006 B2 | 6/2018 |

OTHER PUBLICATIONS

Office Action issued for counterpart German Application No. 102019114856.1, issued by the German Patent Office dated Dec. 17, 2019.

First Office Action issued for counterpart Chinese Application No. 201910475656.1, issued by the Chinese Patent Office dated Dec. 25, 2019.

* cited by examiner

DRIVING DEVICE AND SWITCHING DEVICE

The contents of the following Japanese patent application(s) are incorporated herein by reference:
2018-139561 filed in JP on Jul. 25, 2018.

BACKGROUND

1. Technical Field

The present invention relates to a driving device and a switching device.

2. Related Art

When the switching elements of the upper and lower arms are switched in the synchronous rectification system, the short-circuit of the upper and lower arms is prevented by providing a dead time between periods in which each arm is set in the on-state. However, during the dead time, the output voltage drops to cause losses. Therefore, a technology is proposed in which when the switching element of one arm is turned off, the switching element of the other arm is turned on in accordance with the fact that the free wheeling current is detected in the other arm to shorten the dead time, and the like (for example, see Patent Documents 1 to 3).

[Patent Document 1] Japanese Patent Application Publication No. 2016-158478
[Patent Document 2] Specification of Japanese Patent No. 5939908
[Patent Document 3] Japanese Patent Application Publication No. 2017-51049

In recent years, it has been desired to further shorten the dead time.

SUMMARY

In a first aspect of the present invention, there is provided a driving device that drives on/off a main switching element to which a free wheeling diode is anti-parallel connected. The driving device may include a determination unit configured to output a determination signal indicating whether the free wheeling current is flowing from the source terminal to the drain terminal of the main switching element. The driving device may include a drive control unit configured to reduce the switching speed when the main switching element is driven from an on-state to an off-state on condition that the determination signal indicating that the free wheeling current is flowing is output.

The drive control unit may reduce a switching speed when the main switching element is driven from the on-state to the off-state on condition that the determination signal indicating that the free wheeling current is flowing is output at any timing between a time when an opposite switching element connected in series to the main switching element is set in the off-state and a time when the main switching element is set in the off-state.

The drive control unit may perform control in which the main switching element is set in the on-state on condition that it is determined that the free wheeling current is flowing, and that an on command signal for turning on the main switching element is input when an opposite switching element is set in the off-state by an off command signal for turning off the opposite switching element connected in series to the main switching element.

The drive control unit may have a gate resistor connected to the gate of the main switching element. The drive control unit may perform control such that a resistance value of the gate resistor when the main switching element is set in the off-state in accordance with the fact that it is determined that the free wheeling current is flowing is larger than a resistance value of the gate resistor when the main switching element is set in the off-state in accordance with the fact that an off command signal for turning off the main switching element is input.

The driving device may include a detection unit configured to detect a voltage between the source terminal and the drain terminal. The determination unit may compare the detected voltage detected by the detection unit with a predetermined threshold voltage to determine whether the free wheeling current is flowing. The threshold voltage may be 0 V.

The driving device may include a detection unit configured to detect the current flowing to the main switching element. The determination unit may compare the detected current detected by the detection unit with a predetermined threshold current to determine whether the free wheeling current is flowing.

According to a second aspect of the present invention, a switching device is provided. The switching device may include the driving device of the first aspect. The switching device may include a main switching element whose gate is driven by a driving device. The switching device may include a free wheeling diode that is anti-parallel connected to the main switching element.

The main switching element may be a wide bandgap semiconductor device. The free wheeling diode may be a parasitic diode of the main switching element.

The summary clause does not necessarily describe all necessary features of the embodiments of the present invention. The present invention may also be a sub-combination of the features described above.

DESCRIPTION OF EXEMPLARY EMBODIMENTS

Figure 1:
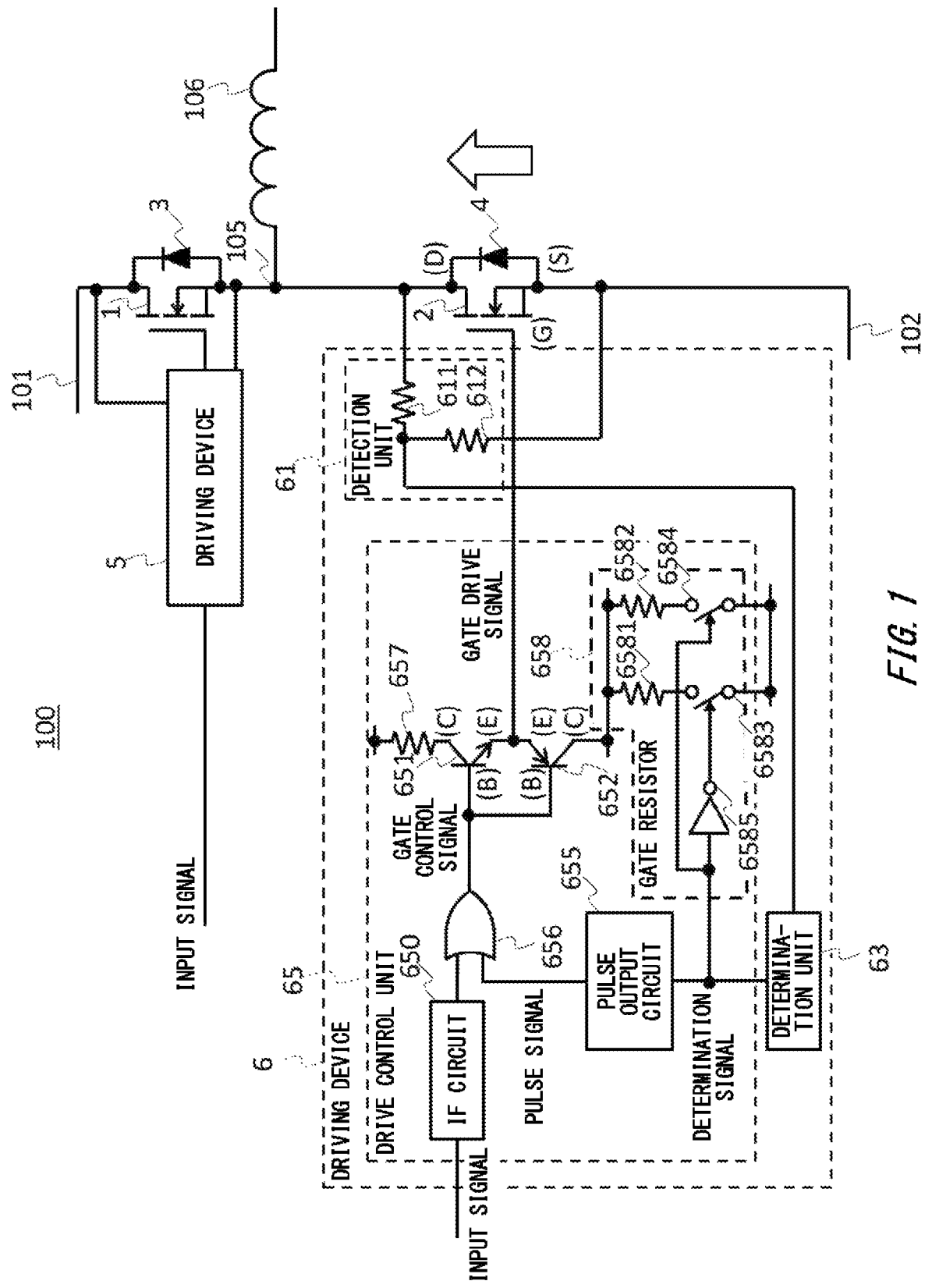
FIG. 1 shows a switching device according to a first embodiment.

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention. Note that the same reference numerals are given to common configurations throughout the embodiments, and redundant explanations are omitted.

1. First Embodiment

FIG. 1 shows a switching device 100 according to the present embodiment.

The switching device 100 shows one phase of a power converter used for driving a motor or supplying electric power as one example, and outputs a converted voltage from a power supply output terminal 105 by switching the connection between a positive power supply line 101 and a negative power supply line 102, and the power supply output terminal 105.

Here, a DC voltage of, for example, 600 to 800 V is applied between the positive power supply line 101 and the negative power supply line 102, and the negative power supply line 102 is connected to the entire reference potential (ground potential, as one example) of the switching device 100. Further, an inductive load 106 is connected to the power supply output terminal 105. Switching device 100 includes a positive side main switching element 1 and a negative side main switching element 2, free wheeling diodes 3 and 4 that are anti-parallel connected to the main switching elements 1 and 2, a positive side driving device 5, and a negative side driving device 6.

[1-1. Main Switching Element]

The main switching elements 1 and 2 each electrically connect or disconnect the drain terminal and the source terminal. For example, the main switching elements 1 and 2 are switched on (also referred to as connection)/off (also referred to as disconnection) by driving devices 5 and 6 to be described later. Here, as one example in the present embodiment, the main switching elements 1 and 2 are sequentially connected in series between the negative power supply line 102 and the positive power supply line 101 to constitute an upper arm and a lower arm in the power converter. The power supply output terminal 105 is connected to the middle point of the main switching elements 1 and 2.

The main switching elements 1 and 2 are silicon semiconductor devices using silicon as a base material.

Instead of this, at least one of the main switching elements 1 and 2 may be a wide bandgap semiconductor device. A wide bandgap semiconductor device is a semiconductor device having a bandgap larger than that of a silicon semiconductor device, and is a semiconductor device including, for example, SiC, GaN, diamond, gallium nitride based material, gallium oxide based material, AlN, AlGaN, ZnO or the like. The wide bandgap semiconductor device can improve the switching speed more than a silicon semiconductor device. Note that in the present embodiment, the main switching elements 1 and 2 may be a Metal Oxide Semiconductor Field Effect Transistor (MOSFET), and the positive power supply line 101 side main switching element may have a parasitic diode (not shown), which is a cathode.

[1-2. Free Wheeling Diode]

The free wheeling diodes 3 and 4 are anti-parallel connected to the main switching elements 1 and 2. The free wheeling diodes 3 and 4 may also be Schottky barrier diodes, and may also be parasitic diodes of MOSFETs. The free wheeling diodes 3 and 4 may also be silicon semiconductor devices, and may also wide bandgap semiconductor devices.

[1-3. Driving Device]

The driving devices 5 and 6 drive the gates of the corresponding main switching elements 1 and 2 based on an input signal input from the outside. Here, the input signal is supplied from a signal source (not shown) to cause the main switching elements 1 and 2 to perform switching in a synchronous rectification system. For example, the input signal is set so as to alternatively turn on one of the main switching elements 1 and 2 (alternately, as one example) except during a dead time in which both main switching elements 1 and 2 are set in the off-state (also referred to as a dead time of upper and lower arms). The dead time of the upper and lower arms is implemented by providing a period (also referred to as a dead time of the input signal) during which the input signal instructs the main switching elements 1 and 2 to respectively maintain the off-state. The input signal may control the main switching elements 1 and 2 by PWM control to output a substantially sinusoidal alternating current from the power supply output terminal 105. The input signal may be separately input to the main switching element 1 and the main switching element 2. Note that in the present embodiment, as one example, when the input signal is high (on command signal), the main switching element 2 is instructed to be in the on-state, and when the input signal is low (off command signal), the main switching element 2 is instructed to be set in the off-state.

The positive side driving device 5 drives the gate of the main switching element 1, and the negative side driving device 6 drives the gate of the main switching element 2. Here, among the main switching elements 1 and 2, an element connected in series to an object to drive the gate is also referred to as an opposite switching element. For example, with respect to the negative side driving device 6, the main switching element 1 is the opposite switching element. Note that since the driving devices 5 and 6 have the same configuration, the negative side driving device 6 will be described in the present embodiment, and the description of the positive side driving device 5 will be omitted. The driving device 6 includes a detection unit 61, a determination unit 63, and a drive control unit 65.

[1-3-1. Detection Unit]

The detection unit 61 detects a voltage between the drain terminal and the source terminal of the main switching element 2. For example, the detection unit 61 includes resistors 611 and 612 connected in series between the drain terminal and the source terminal and dividing the voltage between the drain terminal and the source terminal. The middle point of the resistors 611 and 612 is connected to the determination unit 63, and supplies the detected voltage to the determination unit 63. Note that the detection unit 61 may not be provided in the driving device 6 as long as the determination unit 63 described later may determine presence or absence of the free wheeling current.

[1-3-2. Determination Unit]

The determination unit 63 outputs a determination signal indicating whether the free wheeling current is flowing from the source terminal to the drain terminal. The determination unit 63 compares the predetermined threshold voltage with the detected voltage to determine whether the free wheeling current is flowing. For example, the determination unit 63 determines that the free wheeling current is flowing in accordance with the fact that the detected voltage detected by the detection unit 61 is less than a predetermined threshold voltage. This reliably detects that the free wheeling current is flowing. The threshold voltage is 0 V as one example, and in this case, it is determined that the free wheeling current is flowing in accordance with the fact that the potential of the source terminal is higher than the potential of the drain terminal. Note that in the present embodiment, for the detected voltage, a forward voltage of the free wheeling diode 4, that is, a voltage when the potential on the cathode is higher than that on the anode (see the hollow arrow in the figure), is regarded a positive voltage. The threshold voltage may also be a negative voltage smaller than 0 V, for example, may also be a negative voltage (−0.8 V) whose absolute value is larger than the threshold voltage (0.6 V, as one example) of the free wheeling diode 4.

In the present embodiment, as one example, the determination unit 63 constantly performs the determination. Further, the determination unit 63 supplies to the drive control unit 65 a determination signal that is continuously high when it is determined that the free wheeling current is flowing.

[1-3-3. Drive Control Unit]

The drive control unit 65 controls the main switching element 2, and perform control in which the switching speed is reduced when the main switching element 2 is switched from the on-state to the off-state on condition that it is determined that, for example, the free wheeling current is flowing (as one example, a determination signal of "high" is output at any timing between a time when the main switching element 1 is set in the off-state and a time when the main switching element 2 is set in the off-state). The drive control unit 65 may switch the main switching element 2 from the on-state to the off-state in accordance with an instruction of the turn-off by the input signal. Further, the drive control unit 65 performs control in which the main switching element 2 is set in the on-state on condition that it is determined that the free wheeling current is flowing in the dead time when the main switching element 1 on the opposite side is set in the off-state by the input signal. The drive control unit 65 includes a first switching element 651, a second switching element 652, a gate resistor 657, a gate resistor 658, an interface (IF) circuit 650, a pulse output circuit 655, and an OR circuit 656.

[1-3-3 (1). First Switching Element, Second Switching Element]

The first switching element 651 and the second switching element 652 supply a gate drive signal (on command signal/off command signal) for instructing the gate terminal of the main switching element 2 to turn on/off.

For example, the first switching element 651 is connected in series with the gate resistor 657 between the first potential (20 V as one example) higher than the reference potential of the negative power supply line 102 and the gate terminal of the main switching element 2. Accordingly, when the first switching element 651 is turned on, the gate drive signal that drives the gate of the main switching element 2 is high, and the main switching element 2 is turned on. In the present embodiment, as one example, the first switching element 651 is an NPN type bipolar transistor, wherein the collector terminal is connected to the first potential, the emitter terminal is connected to the gate terminal of the main switching element 2, and the base terminal is connected to the IF circuit 650 (the OR circuit 656 as one example in the present embodiment). Accordingly, the first switching element 651 is set in the on-state when the input gate drive signal is high.

The second switching element 652 is connected in series with the gate resistor 658 between the second potential (−5 V as one example) lower than the reference potential and the gate terminal of the main switching element 2. Accordingly, when the second switching element 652 is turned on, the gate drive signal is low, and the main switching element 2 is turned off. In the present embodiment, as one example, the second switching element 652 is a PNP bipolar transistor, wherein the collector terminal is connected to the second potential, and the emitter terminal is connected to the gate terminal of the main switching element 2, and the base terminal is connected to the IF circuit 650 (the OR circuit 656 as one example in the present embodiment). Accordingly, the second switching element 652 is set in the on-state when the input gate drive signal is low.

Note that the first switching element 651 and the second switching element 652 are not limited to bipolar transistors, but may be a semiconductor device of another structure such as a MOSFET.

[1-3-3 (2). Gate Resistor]

The gate resistor 657 is a resistor used to set the main switching element 2 in the on-state and is connected to the gate terminal of the main switching element 2. Note that although the gate resistor 657 is disposed between the first switching element 651 and the first potential as one example in the present embodiment, it may be disposed between the first switching element 651 and the middle point of the first switching element 651 and the second switching element 652.

The gate resistor 658 is a resistor used to set the main switching element 2 in the off-state and is connected to the gate terminal of the main switching element 2. The gate resistor 658 has a variable resistance value, and in the present embodiment, includes, as one example, resistors 6581 and 6582, switches 6583 and 6584, and a NOT circuit 6585. The resistors 6581 and 6582 are connected in series to the second switching element 652 between the gate terminal of the main switching element 2 and the second potential so as to be parallel to each other.

In the present embodiment, as one example, the resistors 6581 and 6582 are disposed between the second switching element 652 and the second potential. The resistance value of the resistor 6581 is smaller than the resistance value of the resistor 6582. The switches 6583 and 6584 are connected in series to the resistors 6581 and 6582, and are switched on and off in accordance with the fact that the signal input from the determination unit 63 is high. The NOT circuit 6585 is disposed between the switch 6583 and the determination unit 63, and inverts the determination signal. With these configurations, for the gate resistor 658, when the determination unit 63 does not determine that the free wheeling current is flowing, the resistance value of the gate resistor 658 is set as the resistance value of the resistor 6581 with the switch 6583 turned on, and when it is determined that the free wheeling current is flowing. The resistance value of the gate resistor 658 is set as the resistance value of the resistor 6582 with the switch 6584 turned on. As a result, a resistance value when the main switching element 2 is set in the off-state in accordance with the fact that it is determined that the free wheeling current is flowing is larger than a resistance value when the main switching element 2 is set in the off-state in accordance with an instruction of turn-off by the input signal. Note that the gate resistor 658 may also have another configuration as long as the resistance value can be changed.

[1-3-3 (3). If Circuit]

The IF circuit 650 receives an input signal from the outside of the driving device 6. In the present embodiment, as one example, the IF circuit 650 supplies an input signal to the OR circuit 656.

[1-3-3 (4). Pulse Output Circuit]

The pulse output circuit 655 supplies to the first switching element 651 a pulse signal that is high on condition that the determination unit 63 determines that the free wheeling current is flowing. In the present embodiment, as one example, the pulse output circuit 655 may output a pulse signal with an edge where the determination signal is high as a trigger. The pulse output circuit 655 supplies a pulse signal to the base terminal of the first switching element 651 via the OR circuit 656. The pulse output circuit 655 may output a pulse signal on condition that it is determined that the free wheeling current is flowing in the dead time when the main switching element 1 is set in the off-state by the input signal. As one example, the pulse output circuit 655 may distinguish the dead time starting when the main switching elements 1 and 2 are set in the off-state by latching the rising edge and the falling edge of the input signal.

[1-3-3 (5). OR Circuit]

OR circuit 656 has an input terminal connected to the IF circuit 650 and the pulse output circuit 655, and an output terminal connected to the base terminals of each of the first switching element 651 and the second switching element 652. Accordingly, the OR circuit 656 supplies, to the first switching element 651 and the second switching element 652, a gate drive signal indicative of a logical sum of the input signal to the main switching element 2 and the pulse signal from the pulse output circuit 655, and outputs the gate drive signal to the gate terminal of the main switching element 2. As a result, the gate control signal and the gate drive signal are high on condition that at least one of the case where the main switching element 2 is instructed to be turned on by the inputted input signal, and the case where it is determined that the free wheeling current is flowing (in the present embodiment, the pulse signal is rising) is satisfied, and the main switching element 2 is set in the on-state. In addition, the gate control signal and the gate drive signal are low on condition that the main switching element 2 is instructed to be turned off by the input signal, and it is not determined that the free wheeling current is flowing is not output (as one example, the pulse signal is falling), and the main switching element 2 is set in the off-state.

According to the switching device 100 described above, the switching speed at which the main switching element 2 is driven from the on-state to the off-state is reduced in accordance with the fact that it is determined that the free wheeling current is flowing, so that the main switching element 2 is driven from the on-state to the off-state, and when the main switching element 1 is turned on after the dead time has elapsed, the speed at which the main switching element 2 is set in the off-state can be reduced. Therefore, since the timing when the main switching element 2 is actually set in the off-state is delayed from the timing when the main switching element 2 is set to the off-state by the input signal, the actual dead time can be shortened. Therefore, the loss due to the voltage drop during the dead time period can be reduced.

In addition, since the time during which the free wheeling current flows is shortened, the deterioration and destruction of the free wheeling diode can be prevented.

Also, since the main switching element 2 is set in the on-state on condition that it is determined that the free wheeling current is flowing in the dead time when the main switching element 1 on the opposite side is set in the off-state, the actual dead time can be further shortened, compared with the case where the main switching element 2 is set in the on-state after the elapse of the dead time set by the input signal. Therefore, the loss due to the voltage drop during the dead time period can be reduced.

In addition, the time during which the free wheeling current flows can be shortened, and the deterioration and destruction of the free wheeling diode can be prevented. In addition, since the main switching element 2 is not set in the on-state when the determination signal is high in the dead time when the main switching element 2 to be switched is set in the off-state, it is possible to prevent the upper and lower arms from being short-circuited by the main switching element 2 immediately after being turned off being turned on again.

[1-4. Operation Mode]

Figure 2:
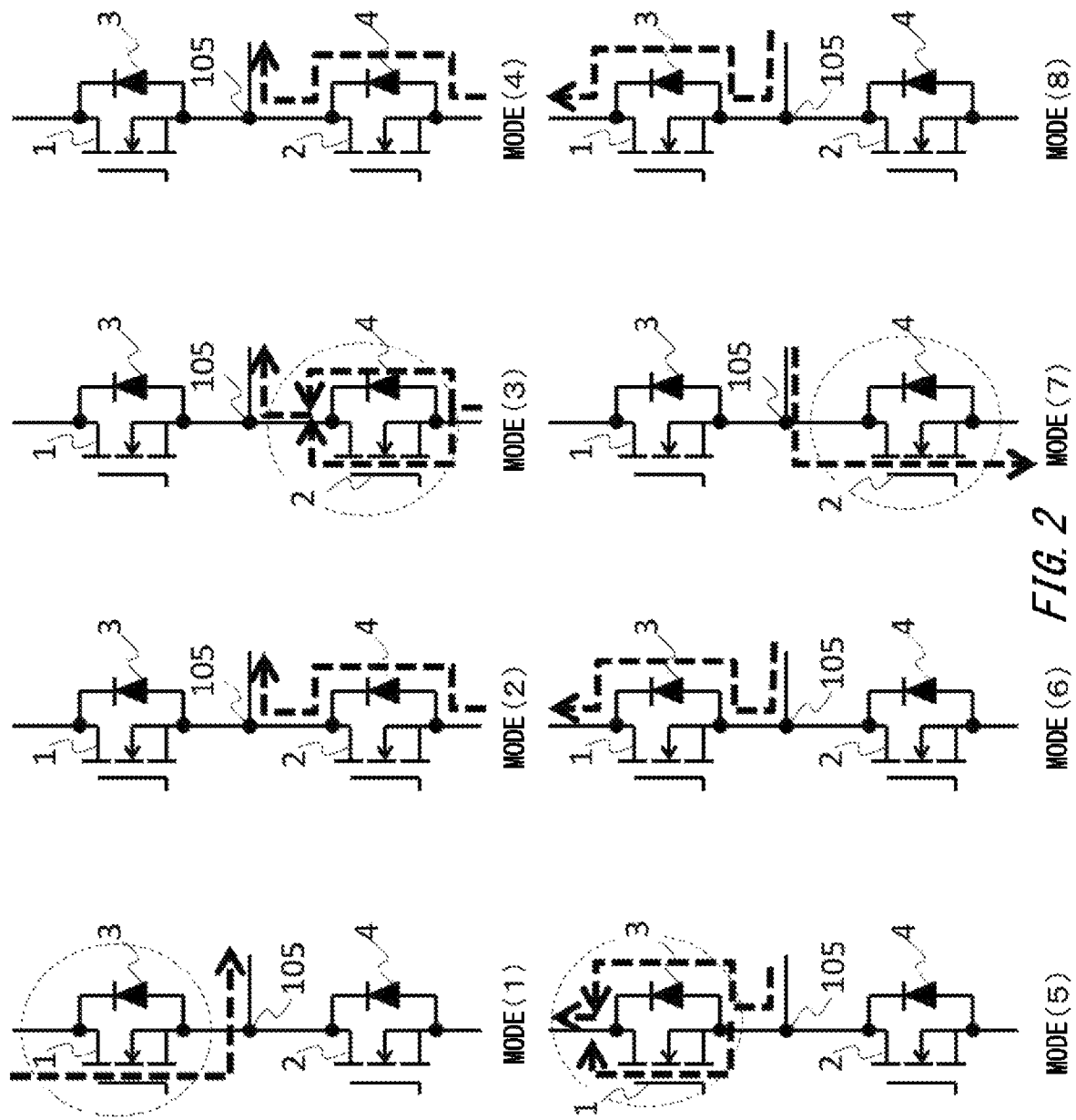
FIG. 2 shows an operation mode of the switching device.

FIG. 2 shows an operation mode of the switching device 100 of the present embodiment. In the figure, arrows of broken lines indicate the flow of current, and the circle of the broken line indicates an element in the connected state (on-state) of the main switching elements 1 and 2. The switching device 100 can take eight operation modes (1) to (8) depending on the on/off-states of the main switching elements 1 and 2, and the direction of the current.

The operation modes (1) to (4) are modes when the output current from the power supply output terminal 105 is positive, and repeat the transition in this order when the main switching elements 1 and 2 are alternately turned on except during a dead time. For example, in the operation mode (1), as a result of the main switching element 1 of the upper arm being turned on, positive current flows to the power supply output terminal 105 through the main switching element 1. The operation mode (2) is a dead time in which the main switching element 1 is turned off, and the main switching elements 1 and 2 are both in the off-state, and the current change from the operation mode (1) is prevented due to a self-induction action of the inductive load 106. As a result, positive current flows to the power supply output terminal 105 through the free wheeling diode 4 of the lower arm. In the operation mode (3), as a result of the main switching element 2 being turned on, a positive current flows to the power supply output terminal 105 through the main switching element 2 and the free wheeling diode 4. The operation mode (4) is a dead time in which the main switching element 2 is turned off, and positive current flows to the power supply output terminal 105 through the free wheeling diode 4 as in the operation mode (2). In this manner, in the operation modes (1) to (4), the lower arm is located on the free wheeling side, and free wheeling current flows to the free wheeling diode 4 of the lower arm.

Similarly, the operation modes (5) to (8) are modes when the output current from the power supply output terminal 105 is negative, and repeat the transition in this order when the main switching elements 1 and 2 are alternately turned on except during a dead time. For example, in the operation mode (5), the main switching element 1 of the upper arm is turned on, and as a result, negative current flows to the power supply output terminal 105 through the main switching element 1 and the free wheeling diode 3. The operation mode (6) is a dead time in which the main switching element 1 is turned off, and as a result of the current change from the operation mode (5) being prevented by the self-induction action of the inductive load 106, a negative current flows to the power supply output terminal 105 through the free wheeling diode 3 of the upper arm. In the operation mode (7), as a result of the main switching element 2 of the lower arm being turned on, a negative current flows to the power supply output terminal 105 through the main switching element 2. The operation mode (8) is a dead time in which the main switching element 2 is turned off, and negative current flows to the power supply output terminal 105 through the free wheeling diode 3 as in the operation mode (6). In this manner, in the operation modes (5) to (8), the upper arm is located on the free wheeling side, and the free wheeling current flows to the free wheeling diode 3 of the upper arm.

[1-5. Operation Waveform]

[1-5-1. Operation Waveform by Input Signal]

Figure 3:
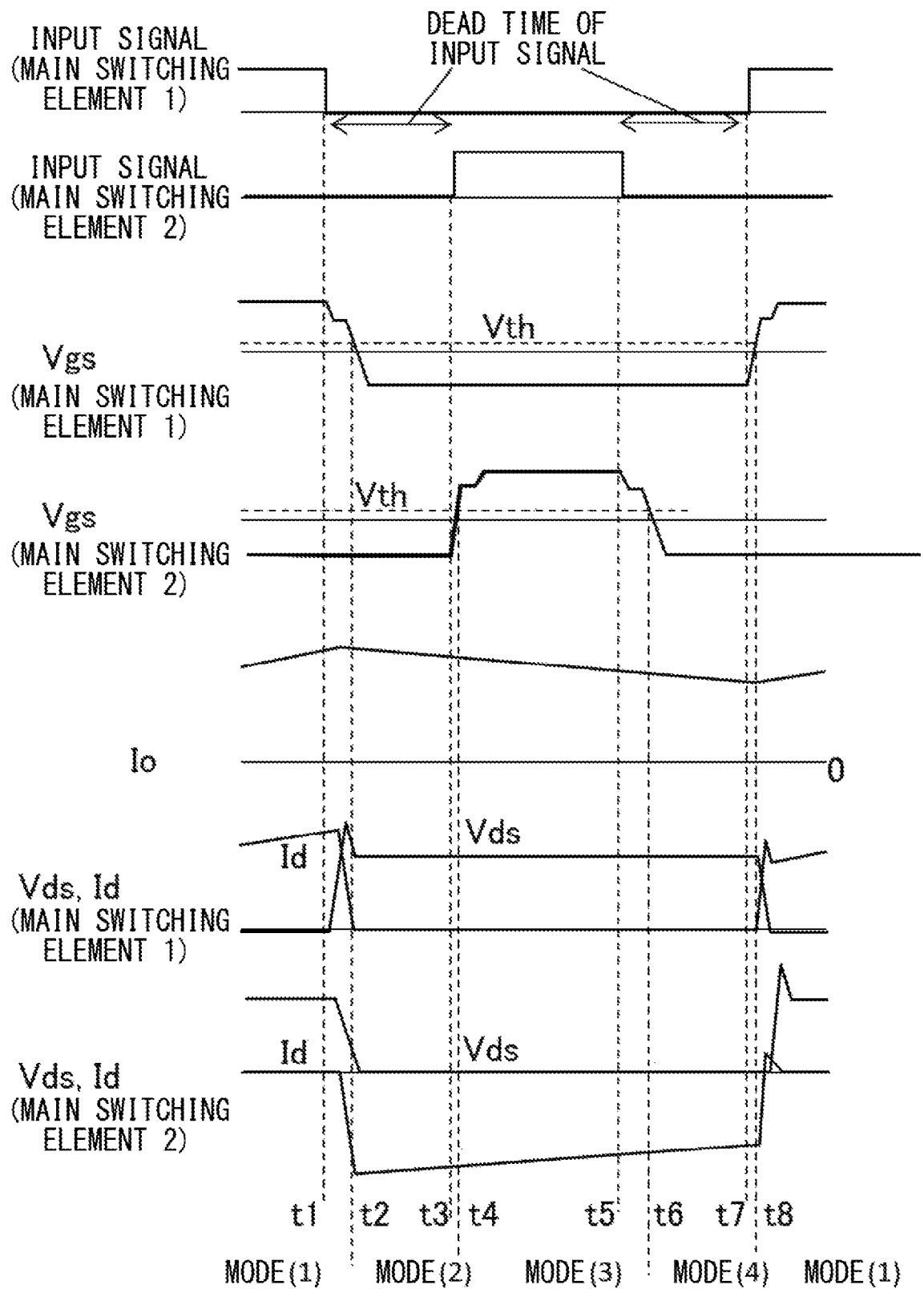
FIG. 3 shows operation waveforms at the time of transition of operation modes (1) to (4)

FIG. 3 shows operation waveforms at the time of transition of the operation modes (1) to (4). In the present embodiment, as one example, after the input signal (off command signal) to be turned off at time t1 is supplied to the main switching element 1, an input signal (on command signal) to be turned on at time t3 is supplied to the main switching element 2 except during the dead time of the input signal in the period from time t1 to t3. In addition, after the input signal to be turned off at time t5 is supplied to the main switching element 2, an input signal to be turned on at time t7 is supplied to the main switching element 1 except during the dead time of the input signal in the period from time t5 to t7. The same applies to the operation waveforms at the time of transition of the operation modes (5) to (8). Note that in this example, the main switching elements 1 and 2 are controlled by only the input signal, and the detection result by the detection unit 61 is not used for control. Also, the horizontal axis in the figure indicates time, and the vertical axis indicates input signals of the main switching elements 1 and 2, the gate-to-source voltage Vgs, the drain-to-source voltage Vds, a drain current Id, and the like.

First, when the input signal to the main switching element 1 switches from high (on command) to low (off command) at time t1, in the main switching element 1, the gate-to-source voltage $Vgs_{(1)}$ decreases, the drain-to-source voltage $Vds_{(1)}$ increases, and the drain current $Id_{(1)}$ decreases, and, in the main switching element 2, the drain-to-source voltage $Vds_{(2)}$ decreases, and current flows in the free wheeling diode 4 (current flows in the negative direction current).

Subsequently, when the gate-to-source voltage $Vgs_{(1)}$ falls below the gate threshold voltage Vth (5 V as one example) at time t2, the operation mode (1) ends and the operation mode (2) starts. Subsequently, when the input signal to the main switching element 2 switches from low to high at time t3, the gate-to-source voltage $Vgs_{(2)}$ increases and exceeds the gate threshold voltage Vth at time t4 to start the operation mode (3). In addition, when the input signal to the main switching element 2 switches from high to low at time t5, the gate-to-source voltage $Vgs_{(2)}$ decreases, and falls below the gate threshold voltage Vth at time t6 to start the operation mode (4). Subsequently, when the input signal to the main switching element 1 switches from low to high at time t7, in the main switching element 1, the gate-to-source voltage $Vgs_{(1)}$ increases, the drain-to-source voltage $Vds_{(1)}$ decreases, and the drain current $Id_{(1)}$ increases, and, in the main switching element 2, the drain-to-source voltage $Vds_{(2)}$ increases, and the drain current $Id_{(2)}$ increases (the absolute value decreases in the negative region). Subsequently, when the gate-to-source voltage $Vgs_{(1)}$ exceeds the gate threshold voltage Vth at time t8, the operation mode (4) ends and the operation mode (1) starts.

[1-5-2. Operation Waveform when Synchronous Rectification is Turned on when Detection of Free Wheeling Current is Used]

Figure 4:
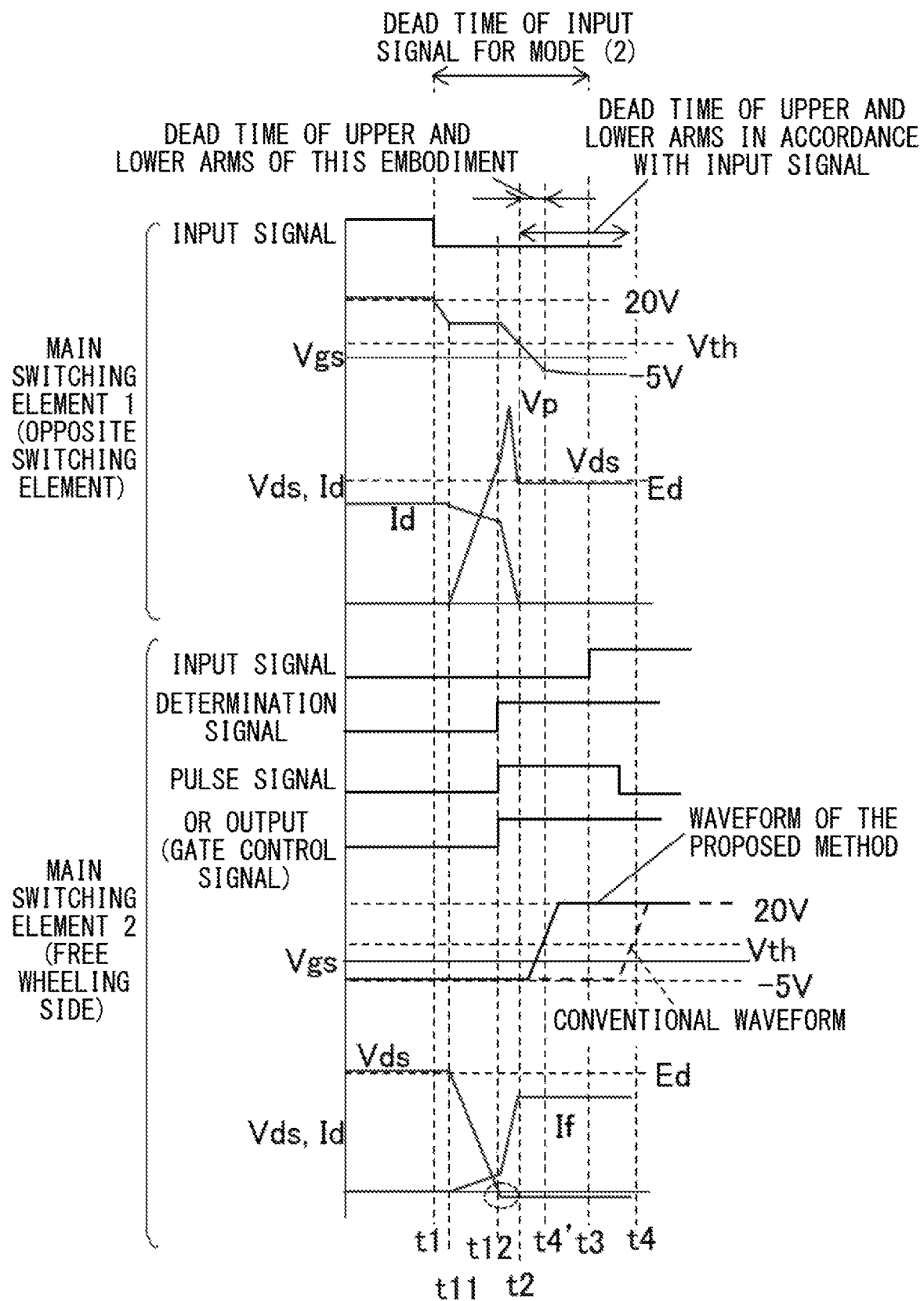
FIG. 4 shows an operation waveform of the switching device of the first embodiment.

FIG. 4 shows operation waveforms of the switching device 100 according to the present embodiment.

In this example, operation waveforms at the time of transition of the above-described operation modes (1) to (3) are shown. That is, after the input signal to be turned off at time t1 is supplied to the main switching element 1 which is the opposite side switching element, an input signal to be turned on at time t3 is supplied to the main switching element 2 which is located on the free wheeling side except during the dead time of the input signal in the period from time t1 to t3. Note that the same applies to the operation waveforms at the time of transition of the operation modes (7), (8), and (5). Also, the horizontal axis in the figure indicates time, and the vertical axis indicates input signals of the main switching elements 1 and 2, the gate-to-source voltage Vgs, the drain-to-source voltage Vds, a drain current Id, free wheeling current If and the like. Further, "Ed" in the figure indicates a DC voltage between the positive power supply line 101 and the negative power supply line 102.

First, when the input signal to the main switching element 1 switches from high (ON) to low (OFF) at time t1, the gate-to-source voltage $Vgs_{(1)}$ decreases, and the turn-off operation starts. Subsequently, when the gate-to-source voltage $Vgs_{(1)}$ decreases to the Miller voltage (at time t11), the change in the gate-to-source voltage $Vgs_{(1)}$ is flat (so-called Miller period), the drain-to-source voltage $Vds_{(1)}$ of the main switching element 1 increases, and the drain current $Id_{(1)}$ decreases.

On the other hand, the drain-to-source voltage $Vds_{(2)}$ decreases in the main switching element 2, and the free wheeling current $If_{(2)}$ passing through the free wheeling diode 4 increases.

Next, when the drain-to-source voltage $Vds_{(2)}$ of the main switching element 2 is zero at time t12, the Miller period ends in the main switching element 1, and the drain current $Id_{(1)}$ sharply decreases (will be zero at time t2). In addition, after the drain-to-source voltage $Vds_{(1)}$ increases to the peak voltage Vp, it decreases to the DC voltage Ed between the positive power supply line 101 and the negative power supply line 102 at time t2, and the gate-to-source voltage $Vgs_{(1)}$ falls below the gate threshold voltage Vth.

Accordingly, the operation mode shifts from mode (1) to mode (2).

On the other hand, in the main switching element 2, the free wheeling current If flowing to the free wheeling diode 4 increases and the free wheeling mode starts. A forward voltage of the free wheeling diode 4 is generated at both ends of the main switching element 2, and the drain-to-source voltage $Vds_{(2)}$ further decreases to be a negative voltage (negative polarity) (see the circle of the broken line in the figure). Accordingly, the determination unit 63 determines that the drain-to-source voltage $Vds_{(2)}$ is less than the threshold voltage (0 V as one example), that is, the free wheeling current is flowing, and the determination signal is high.

When the determination signal is high, a high pulse signal is supplied from the pulse output circuit 655 to the OR circuit 656. As a result, the gate control signal to the main switching element 2 is high regardless of the state of the input signal to the main switching element 2. As a result, the gate-to-source voltage $Vgs_{(2)}$ of the main switching element 2 rises and exceeds the gate threshold voltage Vth at time t4', so that the operation mode shifts from mode (2) to mode (3) (see "the waveform of the proposed method" in the figure). On the other hand, when the gate-to-source voltage $Vgs_{(2)}$ rises in accordance with the fact that the input signal is high at time t3, the gate-to-source voltage $Vgs_{(2)}$ exceeds the gate threshold voltage at time t4 after time t3, t4', and the operation mode shifts from mode (2) to mode (3) (see "conventional waveform" in the figure). Therefore, according to the present embodiment, the actual dead time of the upper and lower arms is shorter than the dead time of the upper and lower arms in accordance with the input signal. Here, as one example in the present embodiment, the pulse signal has a fixed length and a pulse width longer than the dead time. Accordingly, the main switching element 2 is maintained in the on-state until the time when the main switching element 2 is set in the on-state by the input signal, for example, until after time t4.

According to the above operation, since the main switching element 2 is maintained in the on-state until after time t4 when the main switching element 2 is set in the on-state by the input signal, so that it is possible to prevent the main switching element 2 from returning to the off-state before time t4 after the main switching element 2 is turned on by the flow of the free wheeling current.

[1-5-3. Operation Waveform when Synchronous Rectification is Turned Off when Detection of Free Wheeling Current is Used]

Figure 5:
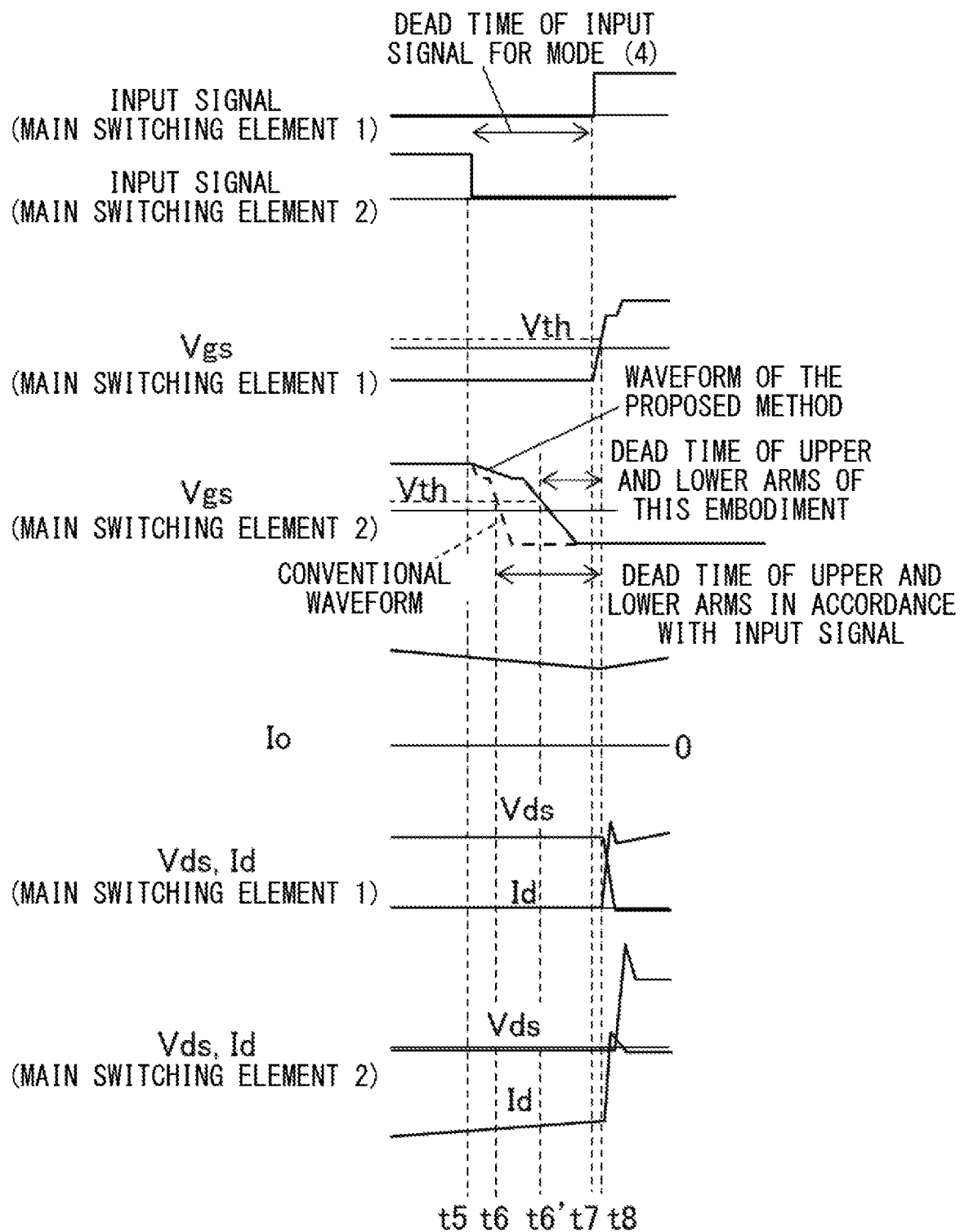
FIG. 5 shows an operation waveform of the switching device of the first embodiment.

FIG. 5 shows another operation waveform of the switching device 100 of the present embodiment. In this example, operation waveforms at the time of transition of the above-described operation modes (3), (4), and (1) are shown. That is, after the input signal to be turned off at time t5 is supplied to the main switching element 2 which is located on the free wheeling side, an input signal to be turned on at time t7 is supplied to the main switching element 1 on the opposite side except during the dead time of the input signal in the period from time t5 to t7. Note that the same applies to the operation waveforms at the time of transition of the operation modes (5) to (7). Also, the horizontal axis in the figure indicates time, and the vertical axis indicates input signals of the main switching elements 1 and 2, the gate-to-source voltage Vgs, the drain-to-source voltage Vds, drain current Id, free wheeling current If and the like.

First, when the input signal to the main switching element 2 switches from high (on command) to low (off command) at time t5, the gate-to-source voltage Vgs$_{(2)}$ decreases, and the turn-off operation starts. On the other hand, the determination unit 63 determines that the free wheeling current is flowing during a period from when the main switching element 1 is set in the off-state at time t2 (see FIG. 3) to when the main switching element 2 is set in the off-state at time t6, in the present embodiment, as one example, a period from time t2 to time t5, that is, during a period of the operation modes (2) and (3). Accordingly, the drive control unit 65 reduces the switching speed at which the main switching element 2 is switched to the off-state. That is, the drive control unit 65 performs control such that the speed at which the main switching element 2 is set in the off-state is slower than the speed at which the main switching element 2 is connected in accordance with the fact that the connection is instructed by the input signal. As a result, since the main switching element 2 is set in the off-state at time t6' which is after time t6 when the main switching element 2 is set in the off-state by the input signal, the actual dead time of the upper and lower arms is shorter than the dead time of the upper and lower arms in accordance with the input signal (see "waveform of the proposed method" and "conventional waveform" in the figure). Here, the drive control unit 65 sets the main switching element 2 in the off-state before a time when the input main switching element 1 is set in the on-state, for example, before time t7.

As one example, the drive control unit 65 may set the switching speed of the main switching element 2 to a speed at which the main switching element 2 is set in the off-state before time t7.

Accordingly, the short-circuit of the upper and lower arms is reliably prevented.

2. Second Embodiment

Figure 6:
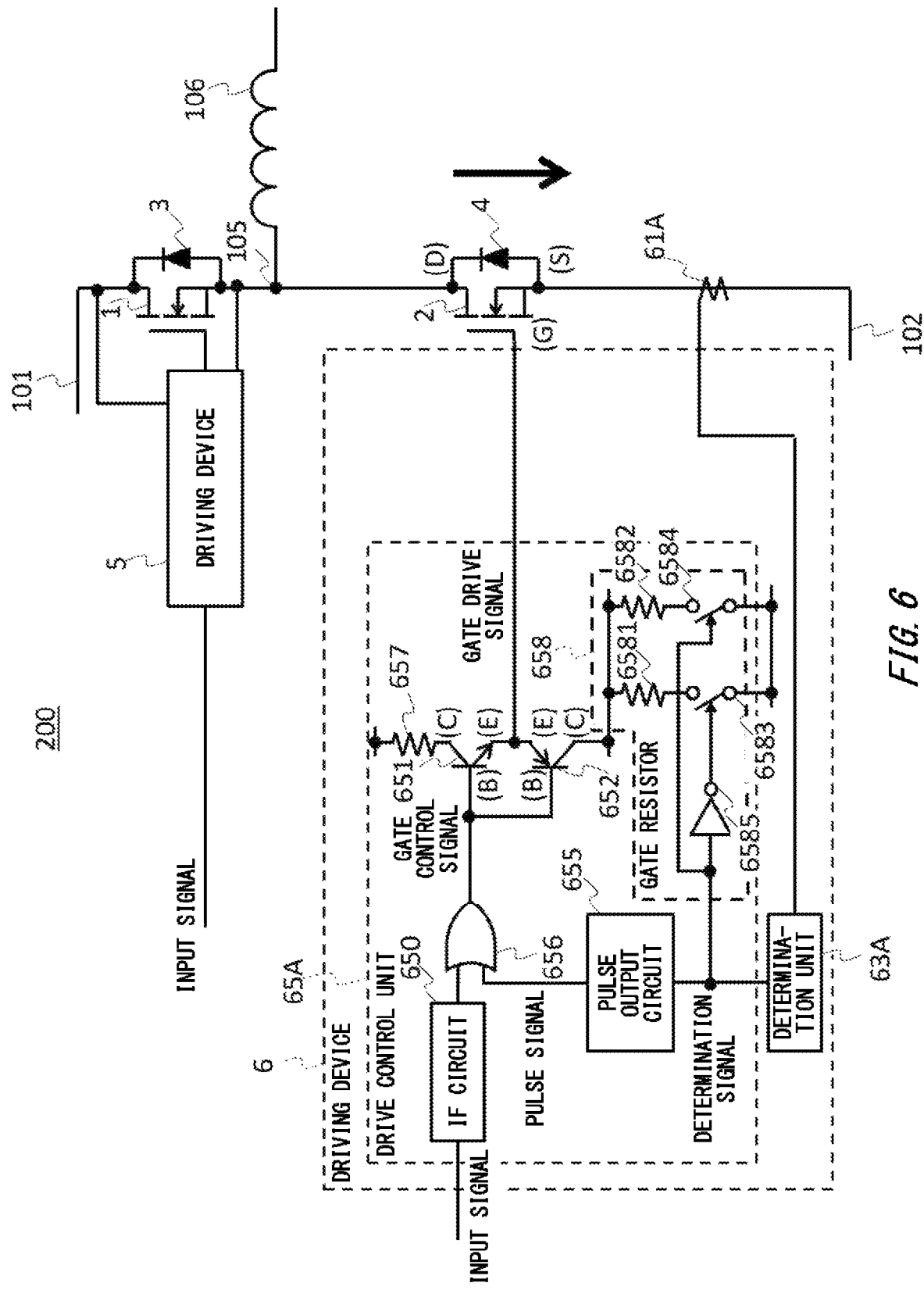
FIG. 6 shows a switching device according to a second embodiment.

FIG. 6 shows a switching device 200 according to the present embodiment.

A drive control unit 65A of the switching device 200 includes a detection unit 61A and a determination unit 63A.

The detection unit 61A detects the current flowing to the main switching element 2. The detection unit 61 may be a current transformer, and may be disposed in series with the main switching element 2 between the power supply output terminal 105 and the negative power supply line 102.

The detection unit 61 may be a current sense provided integrally with the main switching element 2.

The determination unit 63A determines that the free wheeling current is flowing in accordance with the fact that the detected current detected by the detection unit 61 is less than a predetermined threshold current when the current flowing from the drain terminal to the source terminal of the main switching element 2 (see thick arrows in the figure) is a positive current. The threshold current may also be 0 A, and may also be a negative current smaller than 0 A.

The above-described switching device 200 can also provide the same effects as those of the above-described first embodiment.

Note that in the above-described embodiment, the drive control unit 65, 65A is described as reducing the switching speed at which the main switching element 2 is set in the off-state by increasing the resistance value of the gate resistor 658, but the second potential may be brought close to the reference potential of the negative power supply line 102.

Also, the drive control unit 65 has been described as bringing the main switching element 2 into a connected state by using a logical sum of the input signal and the pulse signal from the pulse output circuit 655 by the OR circuit 656, but the main switching element 2 may be is set in the on-state independently by each of the input signal and the pulse signal from the pulse output circuit 655. For example, in addition to setting the main switching element 2 in the on-state during a period when the connection is instructed by the input signal, drive control unit 65 may turn on the main switching element 2 on condition that the pulse signal from the pulse output circuit 655 is high in a dead time when main switching element 1 is set in the off-state. As one example, the drive control unit 65 may distinguish the dead time starting when the main switching element 1 is set in the off-state, and the dead time starting when main switching element 2 is set in the off-state by latching the state of the main switching element 2.

Furthermore, the determination unit 63 may determine whether the free wheeling current is flowing at a dead time when the main switching element 1 is set in the off-state by the input signal. Further, the pulse output circuit 655 may not be included in the drive control unit 65, and the determination unit 63 may supply to the OR circuit 656 a signal that is high during a period in which it is determined that the free wheeling current is flowing. According to such a configuration, it is possible to prevent the upper and lower arms from being short-circuited by the main switching element 2 which has been turned off being turned on again.

Also, although the pulse output circuit 655 has been described as outputting a pulse signal having a fixed pulse width, it may output a pulse signal having a variable pulse width. For example, the pulse output circuit 655 may also output a pulse signal that continues to be high until the input signal to the main switching element 2 rises when the determination unit 63 determines that the free wheeling current is flowing. According to such a configuration, it is possible to prevent the main switching element 2 from returning to the off-state during the dead time set by the input signal.

Further, the drive control unit 65, 65A is described as performing control in which the main switching element 2 is set in the on-state on condition that it is determined that the free wheeling current is flowing in the dead time when the main switching element 1 is set in the off-state, but this control may not necessarily be performed. In this case, the drive control unit 65, 65A may not have the pulse output circuit 655 and the OR circuit 656. In addition, determination unit 63 may determine whether the free wheeling current is flowing at any timing between a time when the main switching element 1 is set in the off-state and a time when the main switching element 2 is set in the off-state.

In addition, although the switching device 100, 200 has been described as including the set of the positive-side main switching element 1 and the positive-side driving device 5, and the set of the negative-side main switching element 2 and the negative-side driving device 6, it may have only one of the sets.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A driving device that drives on/off a main switching element to which a free wheeling diode is anti-parallel connected, the driving device comprising:
   a determination unit configured to output a determination signal indicating whether free wheeling current is flowing from a source terminal to a drain terminal of the main switching element; and
   a drive control unit configured to reduce a switching speed when the main switching element is driven from an on-state to an off-state on condition that the determination signal indicating that the free wheeling current is flowing is output, wherein
   the drive control unit includes:
      a pulse output circuit that receives the determination signal and outputs a pulse signal that becomes high in response to the determination signal indicating that the free wheeling current is flowing; and
      an OR circuit that (i) receives the pulse signal and an input signal for controlling the on-state and the off-state of the main switching element, the input signal being supplied from outside the driving device and (ii) supplies, to the main switching element, a gate driving signal being a logical sum of the input signal and the pulse signal.

2. The driving device according to claim 1, wherein the drive control unit reduces a switching speed when the main switching element is driven from an on-state to an-off-state on condition that the determination signal indicating that the free wheeling current is flowing is output at any timing between a time when an opposite switching element connected in series to the main switching element is set in an off-state and a time when the main switching element is set in an off-state.

3. The driving device according to claim 1, wherein the drive control unit performs control in which the main switching element is set in an on-state on condition that it is determined that the free wheeling current is flowing and that an on command signal for turning on the main switching element is input when an opposite switching element connected in series to the main switching element is set in an off-state by an off command signal for turning off the opposite switching element.

4. The driving device according to claim 1,
   wherein the drive control unit includes a gate resistor connected to a gate of the main switching element, and
   performs control such that a resistance value of the gate resistor when the main switching element is set in an off-state in accordance with a fact that it is determined that the free wheeling current is flowing is larger than a resistance value of the gate resistor when the main switching element is set in an off-state in accordance with a fact that an off command signal for turning off the main switching element is input.

5. The driving device according to claim 1, further comprising
   a detection unit configured to detect a voltage between the source terminal and the drain terminal,
   wherein the determination unit compares a detected voltage detected by the detection unit with a predetermined threshold voltage to determine whether the free wheeling current is flowing.

6. The driving device according to claim 5, wherein the threshold voltage is 0 V.

7. The driving device according to claim 1, further comprising
   a detection unit configured to detect current flowing through the main switching element,
   wherein the determination unit compares detected current detected by the detection unit with a predetermined threshold current to determine whether the free wheeling current is flowing.

8. A switching device comprising:
   the driving device according to claim 1;
   the main switching element whose gate is driven by the driving device; and
   the free wheeling diode that is anti-parallel connected to the main switching element.

9. The switching device according to claim 8, wherein the main switching element is a wide bandgap semiconductor device.

10. The switching device according to claim 8, wherein the free wheeling diode is a parasitic diode of the main switching element.

* * * * *